(12) United States Patent
Jeong et al.

(10) Patent No.: US 10,103,216 B2
(45) Date of Patent: Oct. 16, 2018

(54) THIN FILM TRANSISTOR SUBSTRATE FOR FLAT PANEL DISPLAY

(71) Applicant: LG DISPLAY CO., LTD., Seoul (KR)

(72) Inventors: Ilgi Jeong, Cheongju-si (KR); Kyunghyun Cho, Jeongeup-si (KR); Suwoong Lee, Paju-si (KR); Sungjin Hong, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/691,488

(22) Filed: Aug. 30, 2017

(65) Prior Publication Data

US 2018/0061927 A1    Mar. 1, 2018

(30) Foreign Application Priority Data

Aug. 31, 2016   (KR) .................. 10-2016-0111613

(51) Int. Cl.
  *H01L 27/32*   (2006.01)
  *H01L 27/12*   (2006.01)
  *H01L 29/786*  (2006.01)

(52) U.S. Cl.
  CPC ...... *H01L 27/3279* (2013.01); *H01L 27/3262* (2013.01); *H01L 27/3272* (2013.01); *H01L 27/124* (2013.01); *H01L 27/1225* (2013.01); *H01L 29/7869* (2013.01); *H01L 29/78633* (2013.01)

(58) Field of Classification Search
  CPC ............. H01L 27/3279; H01L 27/3262; H01L 27/3272; H01L 27/1225; H01L 27/124; H01L 29/78633; H01L 29/7869
  See application file for complete search history.

(56) References Cited

U.S. PATENT DOCUMENTS

| | | | |
|---|---|---|---|
| 2004/0119071 A1* | 6/2004 | Takahara | G02F 1/136227 257/59 |
| 2011/0090191 A1* | 4/2011 | Lee | H01L 27/1214 345/206 |

FOREIGN PATENT DOCUMENTS

| | | |
|---|---|---|
| KR | 20150100568 A | 9/2015 |
| KR | 20150101414 A | 9/2015 |
| KR | 20170001881 A | 1/2017 |

* cited by examiner

*Primary Examiner* — Karen Kusumakar
(74) *Attorney, Agent, or Firm* — Seed Intellectual Property Law Group LLP

(57) ABSTRACT

The present disclosure relates to a thin film transistor substrate for flat panel display including an organic light emitting diode display. The present disclosure provides a device comprising: a substrate; a scan line extending in a first direction on the substrate; a buffer layer on the scan line; a semiconductor layer extending in a second direction and crossing the scan line on the buffer layer; a gate insulating layer on the semiconductor layer; a gate electrode connected to the scan line, and extending in the first direction and crossing the semiconductor layer on the gate insulating layer; an intermediate insulating layer on the gate electrode; a data line crossing the scan line on the intermediate insulating layer; a source electrode branching from the data line and contacting a first side of the semiconductor layer; and a drain electrode facing the source electrode and contacting a second side of the semiconductor layer.

11 Claims, 10 Drawing Sheets

THIN FILM TRANSISTOR SUBSTRATE FOR FLAT PANEL DISPLAY

This application claims the benefit of Korea Patent Application No. 10-2016-0111613 filed on Aug. 31, 2016, which is incorporated herein by reference for all purposes as if fully set forth herein.

BACKGROUND

Technical Field

The present disclosure relates to a thin film transistor substrate for flat panel display including an organic light emitting diode display. Especially, the present disclosure relates to a thin film transistor substrate for a large and/or ultra high density flat panel display in which the parasitic capacitance is reduced and it is driven in high speed by increasing the insulating property between the scan line and the data line.

Description of the Related Art

Nowadays, various flat panel displays (or 'FPD') are developed for overcoming many drawbacks of the cathode ray tube (or 'CRT') which is heavy and bulky. The flat panel display devices include the liquid crystal display device (or 'LCD'), the field emission display (FED), the plasma display panel (or 'PDP'), the electro-luminescence device (or 'EL') and so on.

As a self-emitting display device, the electro-luminescence device has the merits that the response speed is very fast, the brightness is very high and the view angle is large. The electro-luminescence device can be categorized an inorganic light emitting diode display and an organic light emitting diode display. As having the good energy efficiencies, the lower leaked current and the easiness for representing color and brightness by current controlling, the OLED using the organic light emitting diode is more required.

FIG. 1 is a diagram illustrating the structure of the organic light emitting diode. As shown in FIG. 1, the organic light emitting diode comprises the organic light emitting material layer, and the cathode and the anode which are facing each other with the organic light emitting material layer therebetween. The organic light emitting material layer comprises the hole injection layer HIL, the hole transport layer HTL, the emission layer EML, the electron transport layer ETL and the electron injection layer EIL. The organic light emitting diode radiates the lights due to the energy from the exciton formed at the excitation state in which the hole and the electron are recombined at the emission layer EML.

The organic light emitting diode radiates the lights due to the energy from the exciton formed at the excitation state in which the hole from the anode and the electron from the cathode are recombined at the emission layer EML. The organic light emitting diode display can represent the video data by controlling the amount (or 'brightness') of the light generated and radiated from the emission layer ELM of the organic light emitting diode as shown in FIG. 1.

The OLED using the organic light emitting diode having the good energy efficiencies can be categorized into the passive matrix type organic light emitting diode display (or PMOLED) and the active matrix type organic light emitting diode display (or AMOLED).

The active matrix type organic light emitting diode display (or AMOLED) shows the video data by controlling the current applying to the organic light emitting diode using the thin film transistor (or TFT). Hereinafter referring to FIGS. 2 and 3, the organic light emitting diode display according to the related art will be explained. FIG. 2 is the exemplary circuit diagram illustrating the structure of one pixel in the active matrix organic light emitting diode display (or AMOLED). FIG. 3 is a plane view illustrating the structure of the AMOLED according to the related art. FIG. 4 is a cross sectional view along the cutting line I-I' for illustrating the structure of the bottom emission type AMOLED according to the related art.

Referring to FIGS. 2 and 3, the active matrix organic light emitting diode display comprises a switching thin film transistor ST, a driving thin film transistor DT connected to the switching thin film transistor ST, and an organic light emitting diode OLE connected to the driving thin film transistor DT. The switching thin film transistor ST is formed where the scan line SL and the data line DL is crossing. The switching thin film transistor ST acts for selecting the pixel which is connected to the switching thin film transistor ST. The switching thin film transistor ST includes a gate electrode SG branching from the scan line SL, a semiconductor channel layer SA overlapping with the gate electrode SG, a source electrode SS and a drain electrode SD.

The driving thin film transistor DT acts for driving an anode electrode ANO of the organic light emitting diode OLE disposed at the pixel selected by the switching thin film transistor ST. The driving thin film transistor DT includes a gate electrode DG connected to the drain electrode SD of the switching thin film transistor ST, a semiconductor channel layer DA, a source electrode DS connected to the driving current line VDD, and a drain electrode DD. The drain electrode DD of the driving thin film transistor DT is connected to the anode electrode ANO of the organic light emitting diode OLE.

A storage capacitance STG is disposed between the drain electrode SD of the switching thin film transistor ST and the drain electrode DD of the driving thin film transistor ST. The first electrode of the storage capacitance STG is connected to the gate electrode DG of the driving thin film transistor DT connected to the drain electrode SD of the switching thin film transistor ST. The second electrode of the storage capacitance STG is connected to the anode electrode ANO of the organic light emitting diode OLE connected to the drain electrode DD of the driving thin film transistor DT.

Referring to FIG. 4, the bottom emission type organic light emitting diode display will be explained. On the transparent substrate SUB of the active matrix organic light emitting diode display, the gate electrodes SG and DG of the switching thin film transistor ST and the driving thin film transistor DT, respectively are formed. On the gate electrodes SG and DG, the gate insulator GI is deposited. On the gate insulator GI overlapping with the gate electrodes SG and DG, the semiconductor layers SA and DA are formed, respectively. On the semiconductor layer SA and DA, the source electrode SS and DS and the drain electrode SD and DD facing and separating from each other are formed. The drain electrode SD of the switching thin film transistor ST is connected to the gate electrode DG of the driving thin film transistor DT via the gate contact hole GH penetrating the gate insulator GI. The passivation layer PAS is deposited on the substrate SUB having the switching thin film transistor ST and the driving thin film transistor DT.

When the semiconductor layers SA and DA include an oxide semiconductor material, due to the high mobility characteristics, the thin film transistor is applied to thin film transistor substrate of flat panel display having the large area, ultra high density and high speed properties. It is preferable that the etch stoppers SE and DE are included for protecting the upper surface of the oxide semiconductor layer in order to ensure the stability of the element. In detail, the etch stoppers SE and DE are formed for protecting the semiconductor layers SA and DA from being back etched by the etchants when patterning out the metal layer portions between the source electrode SS or DS and the drain electrode SD or DD.

The color filter CF is disposed at the anode electrode ANO lately formed. It is preferable that the color filter CF has a large area as possible within the pixel area. For example, the color filter CF may be formed as overlapped with some portions of the data line DL, the driving current line VDD and the scan line SL. The upper surface of the substrate having the color filter CF is not in even and/or smooth conditions, but in uneven and/or rugged conditions having many steps. So, to make the upper surface in planar and even conditions, the over coat layer OC is deposited on the whole surface of the substrate OC.

Then, on the over coat layer OC, the anode electrode ANO of the organic light emitting diode OLE is formed. Here, the anode electrode ANO is connected to the drain electrode DD of the driving thin film transistor DT through the pixel contact hole PH penetrating the over coat layer OC and the passivation layer PAS.

On the substrate SUB having the anode electrode ANO, a bank BN is formed over the area having the switching thin film transistor ST, the driving thin film transistor DT and the various lines DL, SL and VDD, for defining the light emitting area. The exposed portion of the anode electrode ANO by the bank BN would be the light emitting area.

On the anode electrode ANO exposed by the bank BN, the organic light emitting layer OL and a cathode electrode CAT are sequentially deposited. When the organic light emitting layer OL includes an organic material radiating white lights, the color allocated at each pixel can be represented by the color filter CF disposed under the organic light emitting layer OL. The organic light emitting diode display as shown in FIG. 4 is called as the bottom emission type organic light emitting diode display.

The organic light emitting diode in the organic light emitting diode display is driven by relatively large current rather than other type display panel such as the liquid crystal display. Therefore, it is preferable that the driving thin film transistor for the organic light emitting diode display has the characteristics for large current driving. For example, the oxide semiconductor material is good element for the organic light emitting diode display. However, as the density of the display panel is getting higher, the thin film transistor is required to have the superior characteristics for the high speed driving with large current.

The oxide semiconductor material has the demerit in which the characteristics may be easily degraded by the lights intruded from the outside. When the lights radiated from the organic light emitting layer are intruded into the oxide semiconductor layer of the thin film transistor, it is hard to ensure the stability of the thin film transistor.

Using the oxide semiconductor material for high speed driving, the top gate structure may be applied to the thin film transistor, unlike the FIG. 4. For the bottom gate structure shown in FIG. 4, as the gate metal layer is disposed under the oxide semiconductor layer, the lights intruded from the bottom side may be blocked into the oxide semiconductor layer. However, when the top gate structure is applied to the bottom emission type organic light emitting diode display, the channel layer is disposed under the gate electrode so that the oxide semiconductor layer may be easily affected and degraded by the lights intruded from the outside.

BRIEF SUMMARY

In order to overcome the above mentioned drawbacks, a purpose of the present disclosure is to provide a thin film transistor substrate for a large and/or ultra high density flat panel display. Another purpose of the present disclosure is to provide a thin film transistor substrate for a flat panel display having superior video quality in which the load of the data line is reduced by removing or minimizing the parasitic capacitance formed at the crossing point between the scan line and the data line. Still another purpose of the present disclosure is to provide a thin film transistor substrate for a flat panel display in which the aperture ratio is maximized by minimizing the size of the thin film transistor. Yet another purpose of the present disclosure is to provide a thin film transistor substrate for a flat panel display in which the characteristics of the thin film transistor is not degraded or changed even though any manufacturing tolerance is occurred during the manufacturing process.

In order to accomplish the above purposes, as well as others, the present disclosure provides a device that includes: a substrate; a scan line extending in a first direction on the substrate; a buffer layer on the scan line; a semiconductor layer extending in a second direction and crossing the scan line on the buffer layer; a gate insulating layer on the semiconductor layer; a gate electrode connected to the scan line, the gate electrode extending in the first direction and crossing the semiconductor layer on the gate insulating layer; an intermediate insulating layer on the gate electrode; a data line crossing the scan line on the intermediate insulating layer; a source electrode branching from the data line and contacting a first side of the semiconductor layer; and a drain electrode facing the source electrode and contacting a second side of the semiconductor layer.

In one embodiment, the gate electrode overlaps the scan line, and the gate electrode is connected to the scan line via a contact hole penetrating the buffer layer and the gate insulating layer.

In one embodiment, the scan line includes a bottle neck portion at an area where the scan line and the gate electrode overlap, the scan line having a narrower width in the bottle neck portion than in other portions of the scan line.

In one embodiment, the gate electrode and the bottle neck portion have a same width and completely overlap each other.

In one embodiment, the scan line has a first side and a second side and a first width between the first side and the second side, the scan line includes a bottle neck portion that extends from the first side of the scan line to a second width that is less than the first width, and the gate electrode is disposed adjacent to the second side of the scan line and is not overlapped with the bottle neck portion.

In one embodiment, the gate electrode and the bottle neck portion are spaced apart from each other with a predetermined distance.

In one embodiment, the device further comprises: a driving current line crossing the scan line on the intermediate insulating layer; a driving thin film transistor connected between the drain electrode and the driving current line; and an organic light emitting diode connected to the driving thin film transistor.

The thin film transistor substrate for flat panel display according to the present disclosure has the structure in which a buffer layer and/or a gate insulating layer are further added to the intermediated insulating layer between the scan line and the data line. Therefore, the parasitic capacitance between the scan line and the data line would be minimized of eliminated. As a result, the load to the data line is reduced and the resistance of the data line is lowered. It can get the superior effect for the high speed driving of the organic light emitting diodes. Further, as the thin film transistor is disposed as overlapping with the scan line, the size of the thin film transistor is minimized. It can get the merits for increasing the aperture ratio by reducing the area ratio of the thin film transistor in the pixel area. In addition, the sizes of the parasitic capacitances of the thin film transistors are similar each other, even though there are manufacturing errors are occurred during the manufacturing process. Therefore, the characteristics of the thin film transistors may be evenly controlled over the large area as to keep the originally designed purpose. The large area and ultra high density flat panel display according to the present disclosure provides a superior video property.

BRIEF DESCRIPTION OF THE SEVERAL VIEWS OF THE DRAWINGS

The accompanying drawings, which are included to provide a further understanding of the disclosure and are incorporated in and constitute a part of this specification, illustrate embodiments of the disclosure and together with the description serve to explain the principles of the disclosure.

In the drawings.

DETAILED DESCRIPTION

Figure 1:
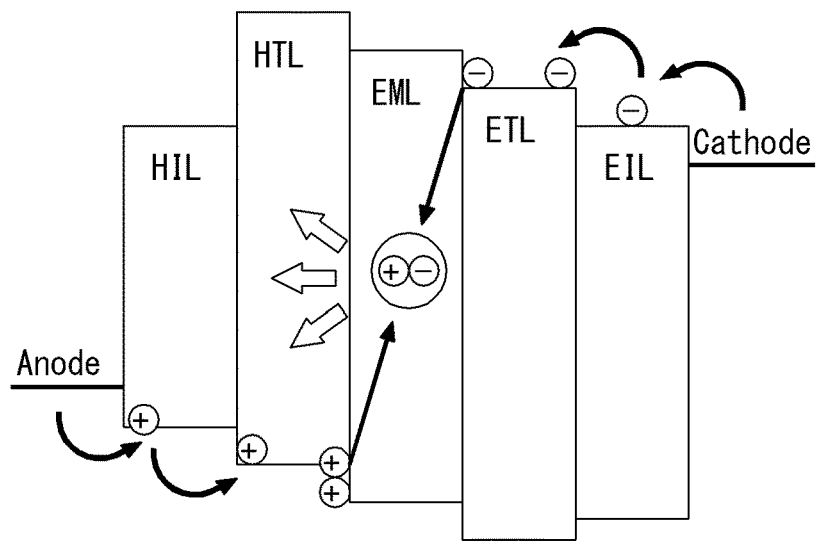
FIG. 1 is a diagram illustrating the structure of the organic light emitting diode according to the related art.
Figure 2:
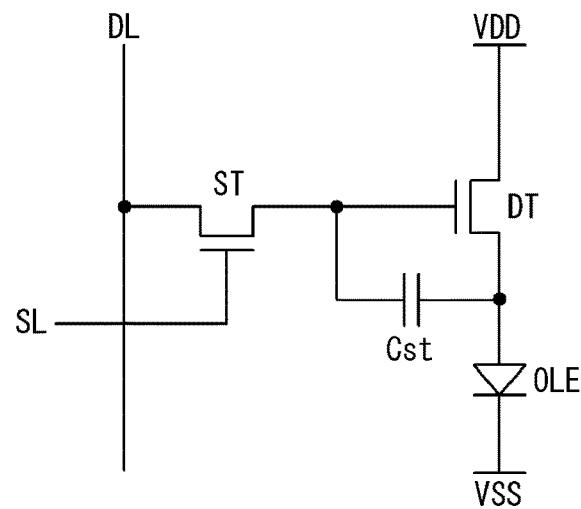
FIG. 2 is the exemplary circuit diagram illustrating the structure of one pixel in the active matrix organic light emitting diode display (or AMOLED) according to the related art.
Figure 3:
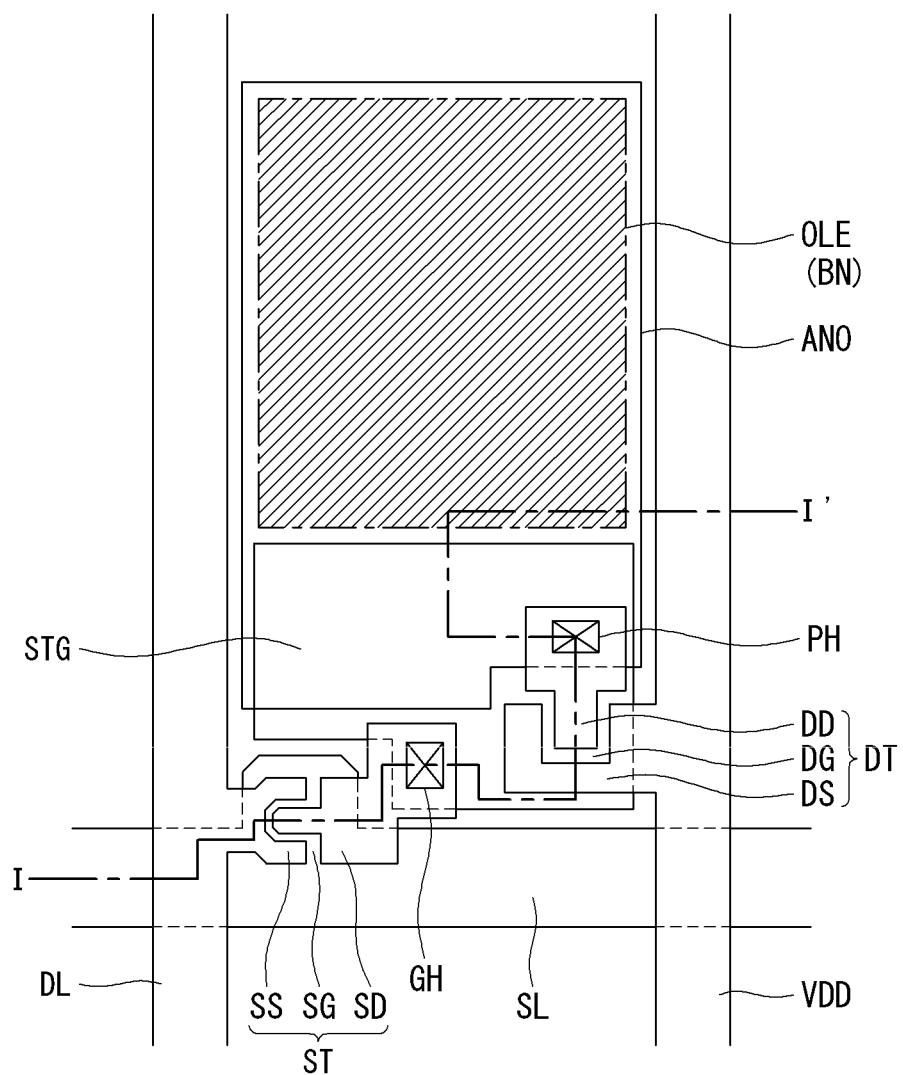
FIG. 3 is a plane view illustrating the structure of one pixel in the AMOLED according to the related art.
Figure 4:
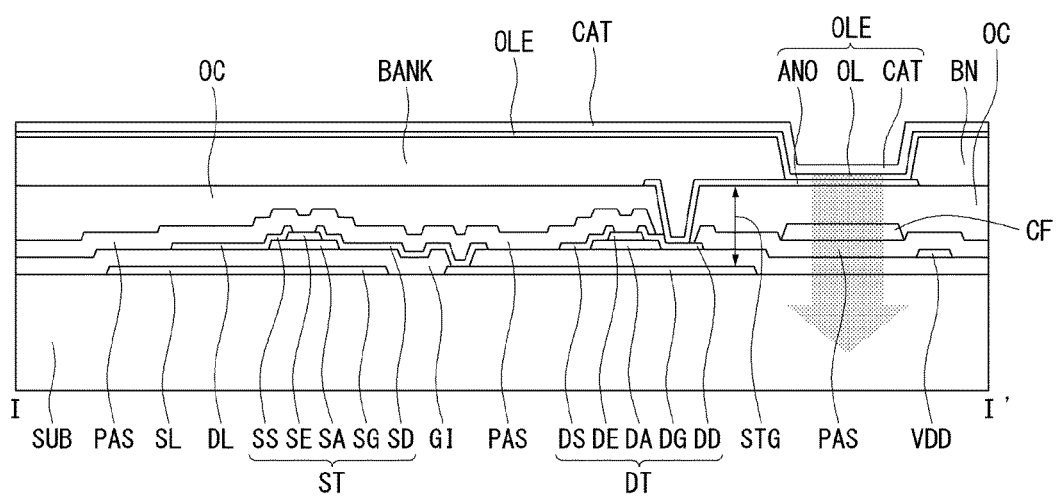
FIG. 4 is a cross sectional view along the cutting line I-I' for illustrating the structure of the bottom emission type AMOLED according to the related art.

Referring to attached figures, embodiments of the present disclosure will be described. Like reference numerals designate like elements throughout the detailed description. However, the present disclosure is not limited to these embodiments but can be applied to various changes or modifications without changing the technical spirit. In the following embodiments, the names of the elements are selected by considering the easiness for explanation so that they may be different from actual names.

The present disclosure provides an organic light emitting diode display having an ultra high density resolution such as UHD rate or 4K rate. As the resolution is getting higher and higher, the pixel size is getting smaller and smaller, and the number of the pixels is increasing. These means that the numbers of the scan line and the data line are increasing. The scan lines and the data lines are crossing each other. As the numbers of the scan lines and the data line are increased, the number of crossing points and the total size of the crossing areas are also increased. As a result, the summation of the parasitic capacitance formed at each crossing point of the scan line and data line is increased. The parasitic capacitance is directly affected to the data voltage provided to the pixel via the data line. For example, the load of the data line is increased so that it is hard to transmit the correct data voltage to the data line. Hereinafter, we provide the structure for removing or minimizing the amount of the parasitic capacitance formed at the crossing points between the scan line and the data line.

First Embodiment

Figure 5:
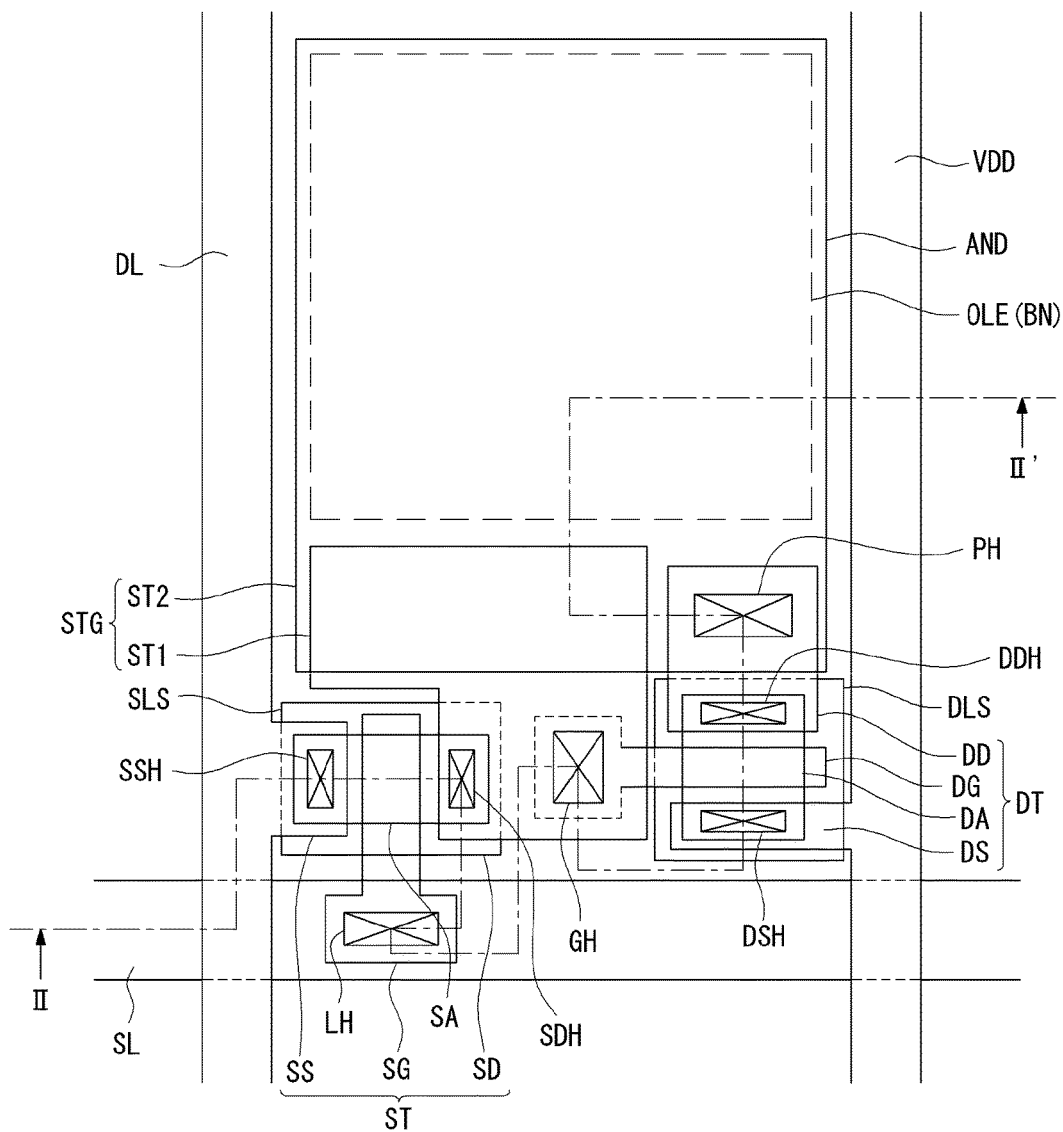
FIG. 5 is a plane view illustrating the structure of one pixel in the organic light emitting diode display according to the first embodiment of the present disclosure.
Figure 6:
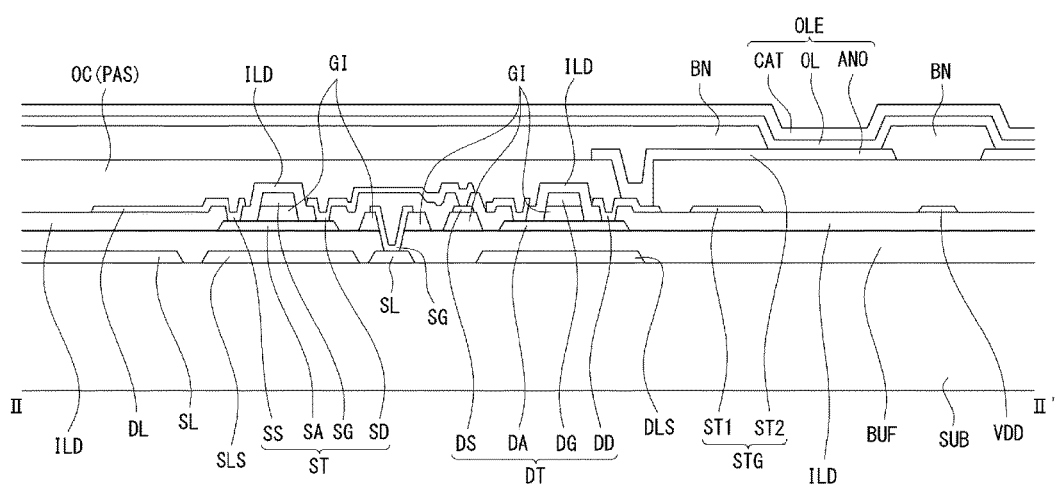
FIG. 6 is a cross sectional view, along the cutting line II-IF in FIG. 5, illustrating the structure of the organic light emitting diode display according to the first embodiment.

Referring to FIGS. 5 and 6, a first embodiment of the present disclosure will be described. FIG. 5 is a plane view illustrating the structure of one pixel in the organic light emitting diode display according to the first embodiment of the present disclosure. FIG. 6 is a cross sectional view, along the cutting line II-IP in FIG. 5, illustrating the structure of the organic light emitting diode display according to the first embodiment.

The organic light emitting diode display according to the first embodiment of the present disclosure comprises a switching thin film transistor ST, a driving thin film transistor DT connected to the switching thin film transistor ST, and an organic light emitting diode OLE connected to the driving thin film transistor DT. The switching thin film transistor ST is disposed at the portion where a scan line SL and a data line DL are crossing. The switching thin film transistor ST acts for selecting the pixel which is connected to the switching thin film transistor ST. The switching thin film transistor ST includes a gate electrode SG connected to the scan line SL, a semiconductor channel layer SA, a source electrode SS branching from the data line DL, and a drain electrode SD separated from the source electrode SS.

The driving thin film transistor DT acts for driving an anode electrode ANO of the organic light emitting diode OLE disposed at the pixel selected by the switching thin film transistor ST. The driving thin film transistor DT includes a gate electrode DG connected to the drain electrode SD of the switching thin film transistor ST, a semiconductor channel layer DA, a source electrode DS connected to the driving current line VDD, and a drain electrode DD. The drain electrode DD of the driving thin film transistor DT is connected to the anode electrode ANO of the organic light emitting diode OLE.

In one or more embodiments of the present disclosure, the semiconductor layers SA and DA include an oxide semiconductor material having a merit for the high speed driving, and the thin film transistors ST and DT have the top gate structure. Further, when the top gate structured thin film transistors ST and DT are applied to the bottom emission type organic light emitting diode display, light shielding layers SLS and DLS are included for protecting the semiconductor layers SA and DA from the lights of outside.

Especially, the scan line SL is formed with the light shielding layers SLS and DLS to dispose at least two insulating layers between the scan line SL and the data line DL. The amount of the parasitic capacitance between the scan line SL and the data line DL is minimized, and the damages caused by the breakdown of the insulation would be prevented.

Referring to FIG. 6, the organic light emitting diode display according to the first embodiment includes a scan line SL made of an opaque metal material and deposited on the transparent substrate SUB. In addition, with the same material at the same layer as the scan line SL, a switching light shielding layer SLS and a driving light shielding layer DLS are disposed where the switching thin film transistor ST and the driving thin film transistor DT are formed later, respectively.

A buffer layer BUF is disposed over the whole surface of the substrate SUB having the scan line SL, the switching light shielding layer SLS and the driving light shielding layer DLS. On the buffer layer BUF, semiconductor layers SA and DA are formed, as the semiconductor layer SA of the switching thin film transistor ST is disposed within the switching light shielding layer SLS and the semiconductor layer DA of the driving thin film transistor DT is disposed within the driving light shielding layer DLS.

On the switching semiconductor layer SA and the driving semiconductor layer DA, a switching gate electrode SG and a driving switching gate electrode DG are disposed having a gate insulating layer GI there-under, respectively. The switching gate electrode SG should be electrically connected to the scan line SL. For example, the switching gate electrode SG is connected to the scan line SL via a light shielding contact hole LH penetrating the gate insulating layer GI and the buffer layer BUF.

The switching thin film transistor ST and the driving thin film transistor DT have the top gate structure. That is, the gate electrodes SG and DG are stacked on the gate insulating layer GI and over the semiconductor layers SA and DA. Implanting the impurity materials into the semiconductor layers SA and DA using the gate electrodes SG and DG as the mask, channel areas, source areas and drain areas are defined. The channel areas are defined as the central areas overlapped with the gate electrodes SG and DG in the semiconductor layers SA and DA, respectively. The source areas and the drain areas are defined at two side portions of the channel areas in the semiconductor layers SA and DA.

An intermediate insulating layer ILD is deposited on the whole surface of the substrate SUB having the gate electrodes SG and DG. On the intermediate insulating layer ILD, a data line DL and a driving current line VDD made of a high conductive metal material such as copper are disposed. As the data line DL and the driving current line VDD are crossing with the scan line, the pixel area is defined. The crossing point between the scan line SL and the data line DL or between the scan line SL and the driving current line VDD, the buffer layer BUF and the intermediate insulating layer ILD are stacked there-between so that the superior insulating property between two crossing lines may be ensured, and the parasitic capacitance between two crossing lines are minimized. Specifically, the line cut or line burning, due to the insulating breakdown where the data line DL is crossing over the scan line SL, may be prevented.

On the intermediate insulating layer ILD, a switching source electrode SS branching from the data line DL and a switching drain electrode SD facing with the switching source electrode SS are formed to complete the switching thin film transistor ST. The switching source electrode SS contacts the source area, the one side portions of the switching semiconductor layer SA, via the switching source contact hole SSH. The switching drain electrode SD contacts the drain area, the other side portions of the switching semiconductor layer SA via the switching drain contact hole SDH.

On the intermediate insulating layer ILD, a driving source electrode DS branching from the driving current line VDD and a driving drain electrode DD facing with the driving source electrode DS are formed to complete the driving thin film transistor DT. The driving source electrode DS contacts the source area, the one portions of the driving semiconductor layer DA via the driving source contact hole DSH. The driving drain electrode DD contacts the drain area, the other side portions of the driving semiconductor layer DA via the driving drain contact hole DDH. Further, the switching drain electrode SD contacts the driving gate electrode DG via the gate contact hole GH.

A passivation layer PAS or a planar layer OC is deposited on the whole surface of the substrate SUB having the source-drain elements. For another example, the passivation layer PAS and the planar layer OC may be sequentially stacked. At the planar layer OC, a pixel contact hole PH is formed for exposing the driving drain electrode DD of the driving thin film transistor DT.

Within the pixel area on the planar layer OC, an anode electrode ANO is formed. The anode electrode ANO contact the driving drain electrode DD of the driving thin film transistor DT via the pixel contact hole PH.

On the substrate SUB having the anode electrode ANO, a bank BN is formed. The bank BN defines a light emission area within the anode electrode ANO. The opened area of the anode electrode ANO not covered by the bank BN is defined as the light emitting area.

On the substrate SUB having the bank BN, an organic light emitting layer OL and a cathode electrode CAT are sequentially stacked. At the light emitting area, an organic light emitting diode is formed by stacking the anode electrode ANO, the organic light emitting layer OL and the cathode electrode CAT. The organic light emitting diode OLE is connected to the driving thin film transistor DT.

In the first embodiment, although not explicitly shown, one or more color filters may be included. For the case of the bottom emission type organic light emitting diode display with the color filter, it is preferable that the color filter is disposed under the anode electrode ANO. For the case of the top emission type organic light emitting diode display with the color filter, it is preferable that the color filter is disposed over the anode electrode ANO. For still another case, the color filter is not included by which the organic light emitting layer OL includes an organic material emitting any one color light among the red light, the green light and the blue light, and the organic light emitting layer OL is isolatedly patterned within each pixel area.

In FIG. 5 explaining the first embodiment, the switching light shielding layer SLS and the driving light shielding layer DLS are formed as the island shape. Otherwise, the light shielding layers SLS and DLS may be connected to the gate electrodes SG and DG to have the double gate structure. For example, the switching light shielding layer SLS may be extended from the scan line SL. The driving light shielding layer DLS may be connected to the driving gate electrode DLS via a contact hole (not shown in figure).

The thin film transistor substrate for the organic light emitting diode display according to the first embodiment has very thick insulating layer including buffer layer BUF and the intermediate insulating layer ILD between the scan line SL and the data line DL. Therefore, the parasitic capacitance may be eliminated or minimized where the scan line SL and the data line DL is crossing each other. As a result, the load at the data line DL is not increased and the superior video quality can be ensured.

Second Embodiment

In the first embodiment, the switching thin film transistor has the structure in which the gate electrode is extruded from the scan line SL. Therefore, as the pixel size is getting smaller (i.e., as the higher resolution), the area ratio of the switching thin film transistor in the pixel area is getting larger.

In the second embodiment, in order to minimize the area for the switching thin film transistor, a structure is provided in which the gate electrode is defined in some portions of the scan line itself. The organic light emitting diode display according to the second embodiment has the structure in which the non emission area ratio in one pixel area is minimized with an ultra high density resolution (UHD rate or more).

Hereinafter, the structure of the switching thin film transistor in the organic light emitting diode display will be explained. Further, in the cross sectional view, only the switching thin film transistor is illustrated. However, the thin film transistor substrate having the switching thin film transistor according to the second embodiment may be applied to the organic light emitting diode display, as further including the driving thin film transistor and the organic light emitting diode. The driving thin film transistor and the organic light emitting diode have the same structure with the first embodiment. The detailed explain for them may not be duplicated, or if required, we will refer to the figures of the first embodiment.

Figure 7:
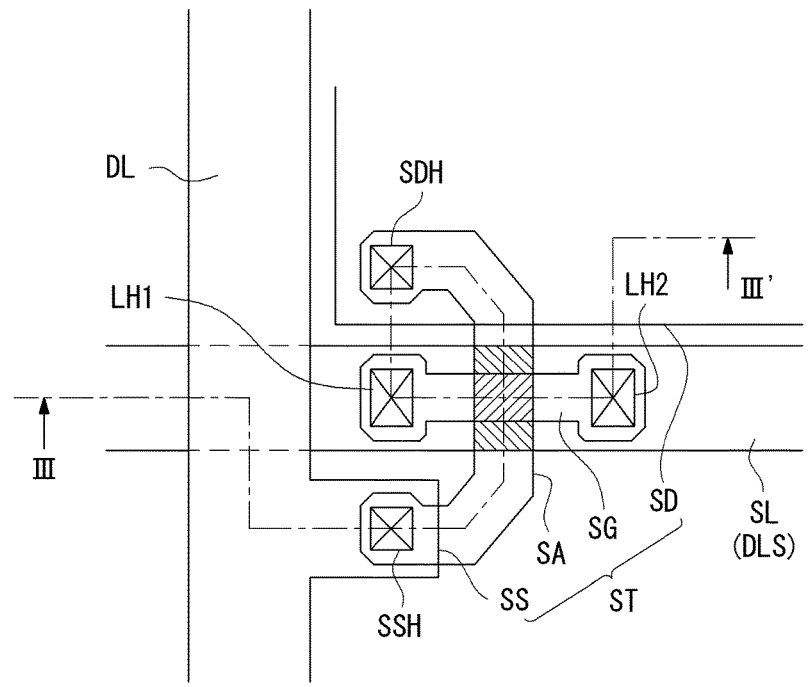
FIG. 7 is a plane view illustrating the structure of a switching thin film transistor in the organic light emitting diode display according to the second embodiment of the present disclosure.
Figure 8:
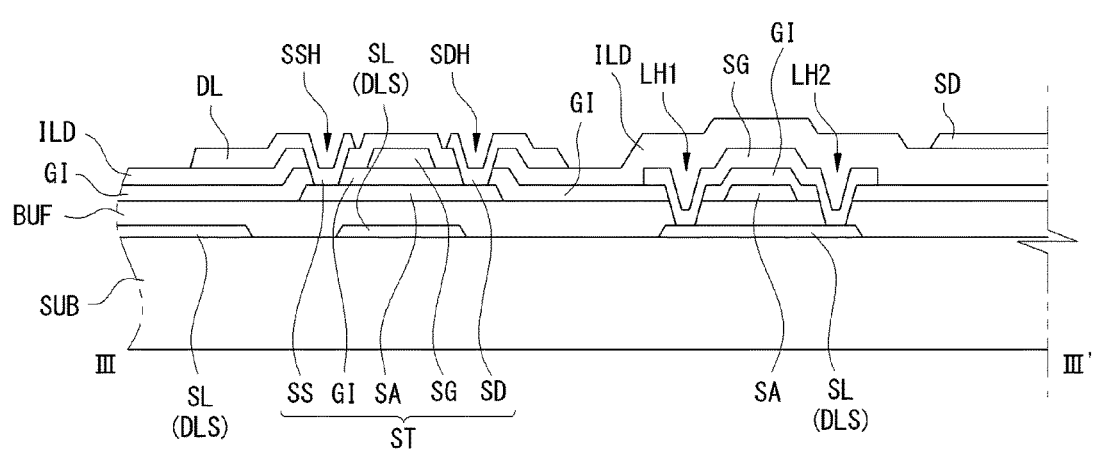
FIG. 8 is a cross sectional view, along the cutting line in FIG. 7, illustrating the structure of the switching thin film transistor according to the second embodiment.

Hereinafter, referring to FIGS. 7 and 8, the second embodiment will be explained. FIG. 7 is a plane view illustrating the structure of a switching thin film transistor in the organic light emitting diode display according to the second embodiment of the present disclosure. FIG. 8 is a cross sectional view, along the cutting line in FIG. 7, illustrating the structure of the switching thin film transistor according to the second embodiment.

In the organic light emitting diode display according to the second embodiment, the switching thin film transistor ST includes a gate electrode SG, a semiconductor layer SA, a source electrode SS and a drain electrode SD. The gate electrode SG is parallel with the scan line SL and overlapped with the scan line SL. The scan line SL is made of the same material as the light shielding layer LS. For example, the scan line SL may be formed with the same material and at the same layer as the driving light shielding layer DLS disposed under the driving thin film transistor DT.

On the scan line SL, a buffer layer BUF is deposited. On the buffer layer BUF, the semiconductor layer SA is disposed as crossing the scan line SL. On the semiconductor layer SA, a gate insulating layer GI is deposited. On the gate insulating layer GI, the gate electrode SG is formed.

The gate electrode SG has a segment shape parallel with the scan line SL. The gate electrode SG is crossing the semiconductor layer SA, and both ends are connected to the scan line SL. The one end of the gate electrode SG contacts the scan line SL via a first contact hole LH1, and the other end of the gate electrode SG contacts to the scan line SL via a second contact hole LH2. The area of the semiconductor layer SA overlapping with the gate electrode SG is defined as the channel area. With the channel area as the center portion, the one side portion of the semiconductor layer SA is defined as the source area and the other portion of the semiconductor layer SA is defined as the drain area.

On the gate electrode SG, an intermediate insulating layer ILD is formed. On the intermediate insulating layer ILD, the data line DL, the source electrode SS and the drain electrode SD are formed. The data line DL extends in a first direction that crosses the scan line SL, which extends in a second direction that is transverse to the first direction. For example, as shown in FIG. 7, the data line DL extends in a vertical direction, while the scan line SL extends in a horizontal direction. The source electrode SS is branched from the data line DL, and contacts the source area of the semiconductor layer SA via a source contact hole SSH. The drain electrode SD contacts the drain area of the semiconductor layer SA via a drain contact hole SDH.

In the second embodiment, the structure is provided in which the gate insulating layer GI is not patterned as having the shape corresponding to the shape of the gate electrode SG. Therefore, the buffer layer BUF, the gate insulating layer GI and the intermediate insulating layer ILD are inserted between the scan line SL and the data line DL. That is, the scan line SL is apart from the data line DL with very thickly stacked insulating layers so that there is no parasitic capacitance or very less amount of the parasitic capacitance. The organic light emitting diode display according to the second embodiment includes the data line DL having no or minimized parasitic load so that the line resistance can be kept in minimized condition. As a result, as this structure is applying to the large and/or ultra high density flat panel display, the flat panel display has the superior video quality.

The switching thin film transistor ST according to the second embodiment has the structure in which the scan line SL is disposed under the semiconductor layer SA and the gate electrode SG is disposed over the semiconductor layer SA. Further, the scan line SL and the gate electrode SG are connected each other. That is, the switching thin film transistor ST has the double gate structure. As a result, the switching thin film transistor ST has much more channel capability than single gate structure so that switching thin film transistor ST may have the smaller size with the same operation capability.

In addition, as the switching thin film transistor ST is disposed over the scan line SL, the area ratio of the thin film transistor in one pixel area may be reduced. In the case that a sensing thin film transistor is further included, the area ratio of the thin film transistors in one pixel area may be getting larger. By applying the second embodiment to this case. The higher aperture ratio may be ensured. For the ultra high density and/or large area display, the organic light emitting diode display according to the second embodiment is much superior than that of the first embodiment.

Third Embodiment

In the second embodiment, the structure is provided in which the scan line SL and the gate electrode SG are overlapped with respect to each other to form the double gate structure. The scan line SL has much wider width than the gate electrode SG. This is for ensuring that the line resistance of the scan line SL is not increased. However, due to the gate-source parasitic capacitance Cgs formed where the source area of the semiconductor layer SA and the scan line SL are overlapped, and the gate-drain parasitic capacitance Cgd formed where the drain area and the scan line SL, it may be hard to maintain the exact characteristics of the thin film transistor.

In FIG. 7, the channel area is the area where the semiconductor layer SA and the gate electrode SG are overlapped, illustrated as having the 45° hatch pattern. At the upper area and the lower area of the channel area, there are the areas where the semiconductor layer SA and the scan line SL are overlapped, illustrated as having the 135° hatch pattern. The gate-source parasitic capacitance Cgs is formed at the upper area, and the gate-drain parasitic capacitance Cgd is formed at the lower area. Due to these parasitic capacitances, the characteristics of the thin film transistor may be changed or deteriorated from the designed intension. Therefore, it is preferable that the upper area and the lower area have the minimized area.

Figure 9:
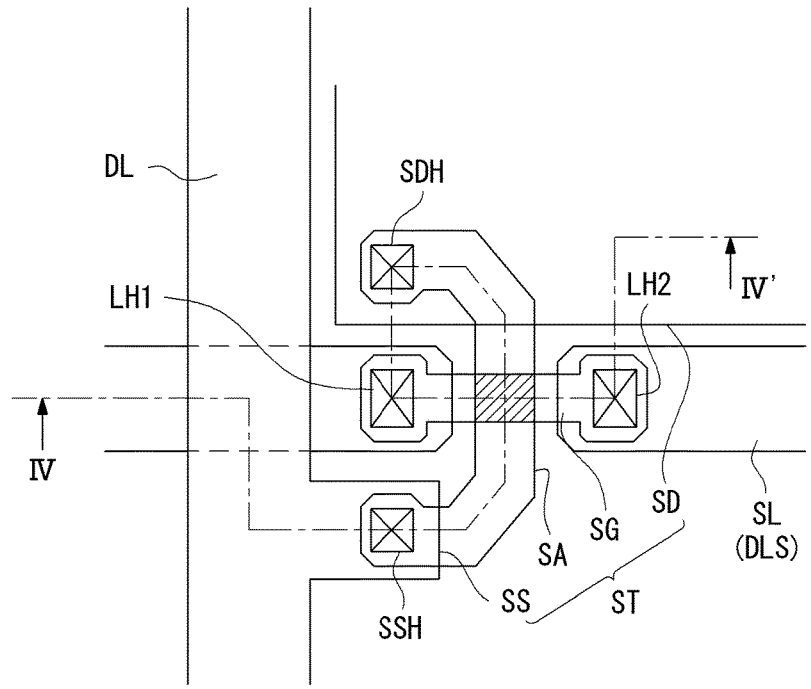
FIG. 9 is a plane view illustrating the structure of a switching thin film transistor in the organic light emitting diode display according to the third embodiment of the present disclosure.
Figure 10:
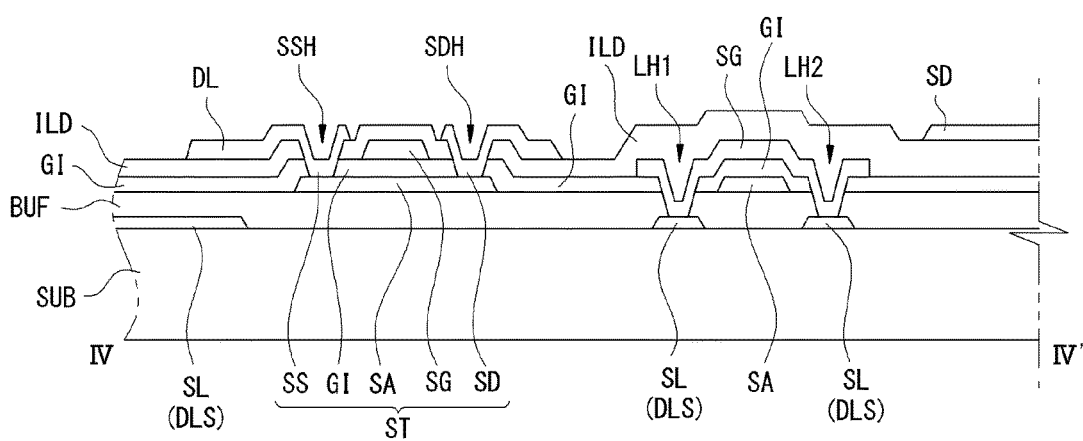
FIG. 10 is a cross sectional view, along the cutting line IV-IV' in FIG. 9, illustrating the structure of the switching thin film transistor according to the third embodiment.

In the third embodiment, the problem caused at the second embodiment is solved. Hereinafter, referring to FIGS. 9 and 10, the third embodiment of the present disclosure will be explained. FIG. 9 is a plane view illustrating the structure of a switching thin film transistor in the organic light emitting diode display according to the third embodiment of the present disclosure. FIG. 10 is a cross sectional view, along the cutting line IV-IV' in FIG. 9, illustrating the structure of the switching thin film transistor according to the third embodiment.

The structure of the thin film transistor substrate for the organic light emitting diode display according to the third embodiment is very similar with that of the second embodiment. Accordingly, a detailed explanation of the duplicated features of the second embodiment will not be provided with respect to the third embodiment.

For the important difference, the switching thin film transistor ST according to the third embodiment has the structure in which the overlapped portion of the scan line SL with the gate line SG is removed. That is, the scan line SL is disconnected at the gate electrode SG of the switching thin film transistor ST. As a result, the switching thin film transistor ST according to the third embodiment has the single gate structure not the double gate structure.

As the semiconductor layer SA is not overlapped with the scan line SL, the gate-source parasitic capacitance Cgs and/or the gate-drain parasitic capacitance Cgd are not formed. Therefore, the switching thin film transistor according to the third embodiment may ensure the exact characteristics.

The thin film transistor substrate for the organic light emitting diode display according to the third embodiment has the structure in which the merits of the first and second embodiments are maintained, and the problem caused in the second embodiment is solved. However, the scan line SL is broken where the switching thin film transistor ST is formed, and the scan line SL is connected by the gate electrode SG. That is, the scan line SL is discontinuous, or is not continuously extended in shape. In this case, the line resistance of the scan line SL may be increased.

Further, the scan line SL is connected to the gate electrode SG via the first contact hole LH1 and the second contact hole LH2. When the scan line SL is connected using the contact holes, the line resistance would be increased due to the contact resistances. For the case of ultra high resolution, as the number of the switching thin film transistor ST is increased, so that the number of the contact holes is also increased. As a result, the line resistance of the scan line SL may be further increased.

Fourth Embodiment

The third embodiment provides the structure of the thin film transistor for solving the problems caused in the second embodiment. However, the third embodiment may cause the increasing of the resistance of the scan line which is not caused in the second embodiment. In the fourth embodiment, the structure is provided of the organic light emitting diode display in which the merits of the third embodiment are ensured and the demerits are overcome.

Figure 11:
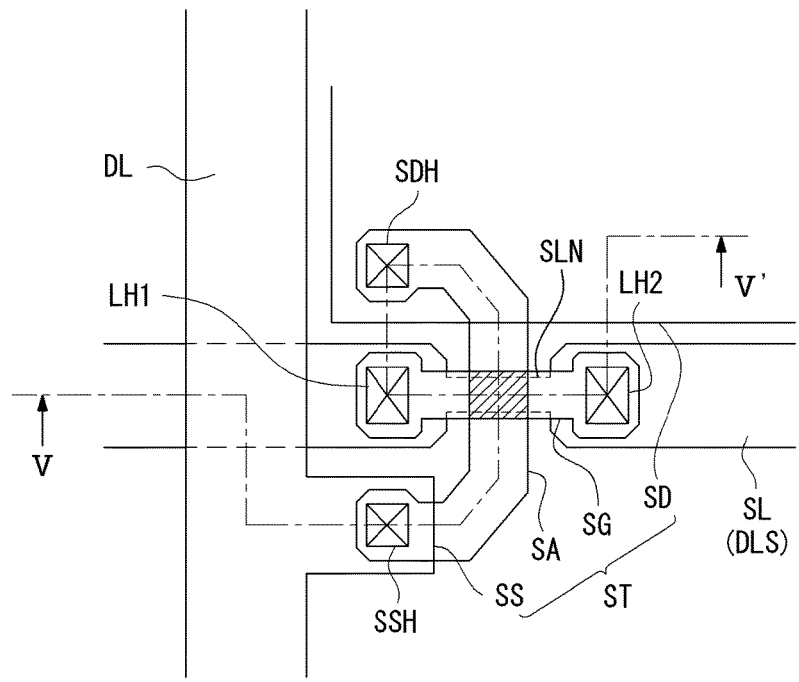
FIG. 11 is a plane view illustrating the structure of a switching thin film transistor in the organic light emitting diode display according to the fourth embodiment of the present disclosure.
Figure 12:
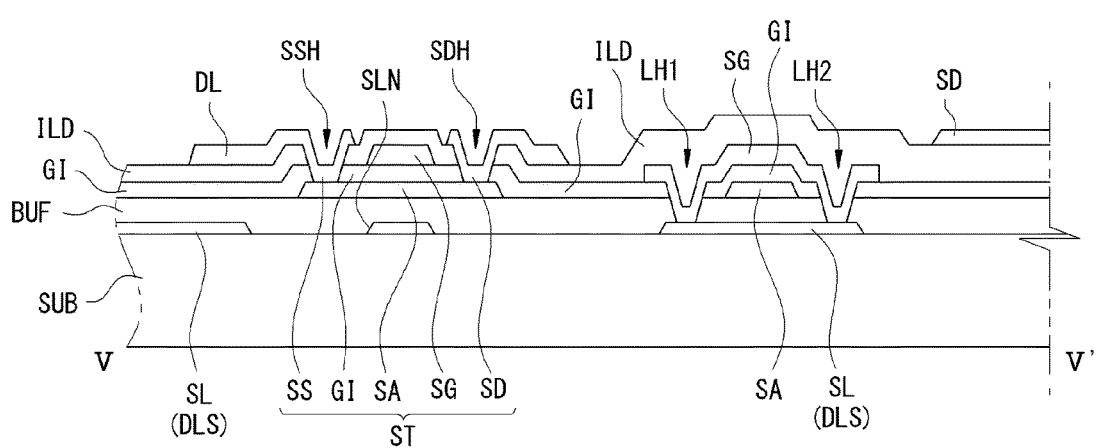
FIG. 12 is a cross sectional view, along the cutting line V-V' in FIG. 11, illustrating the structure of the switching thin film transistor according to the fourth embodiment.

Hereinafter, referring to FIGS. 11 and 12, the fourth embodiment will be explained. FIG. 11 is a plane view illustrating the structure of a switching thin film transistor in the organic light emitting diode display according to the fourth embodiment of the present disclosure. FIG. 12 is a cross sectional view, along the cutting line V-V' in FIG. 11, illustrating the structure of the switching thin film transistor according to the fourth embodiment.

The structure of the thin film transistor for the organic light emitting diode display according to the fourth embodiment is very similar with that of the third embodiment. Further it is also similar with the third embodiment or the second embodiment. The duplicated explanation of features already explained with respect to the second or third embodiment may be omitted for the sake of brevity.

The main difference from the third embodiment, the switching thin film transistor ST according to the fourth embodiment has the structure in which the scan line SL is not disconnected where the scan line SL is overlapped with the gate electrode SG, but is continuously connected over the whole length of the scan line SL. The main difference from the second embodiment, the switching thin film transistor ST includes a bottle neck portion SLN having a width very similar with the width of the gate electrode SG where the scan line SL is overlapped with the gate electrode SG. Preferably, the width of the bottle neck portion SLN is almost same with the width of the gate electrode SG. Otherwise, the width of the bottle neck portion SLN may be little wider or narrower than the width of the gate electrode SG. It is more preferable that the width of the bottle neck portion SLN is narrower than the width of the gate electrode SG.

By comparing with the third embodiment, the scan line SL has the continuous line shape over the whole length without any broken portion where the switching thin film transistor ST is formed. As a result, the resistance increasing of the scan line SL may be prevented. Even though the line resistance may be slightly increased because the bottle neck portion SLN has narrower width than other portions, the line resistance is not increased so much because the gate electrode SG is also connected in parallel with the bottle neck portion SLN. That is, the gate electrode SG has a side function for preventing the resistance from being increased too much at the bottle neck portion SLN.

Further, as the second embodiment, the switching thin film transistor ST has the double gate structure. By comparing with the second embodiment, the thin film transistor according to the fourth embodiment has the bottle neck portion SLN acting as the auxiliary gate electrode having the similar width with the width of the gate electrode SG. Therefore, the source area and the drain area of the semiconductor layer SA are not overlapped with the bottle neck portion SLN. The fourth embodiment provides the thin film transistor which has the double gate structure but have not the gate-source parasitic capacitance Cgs and the gate-drain parasitic capacitance Cgd.

Fifth Embodiment

The fourth embodiment provides a preferred example in which the merits of the first to third embodiments are retained and the problems of them are solved. However, the fourth embodiment is the ideal case. Actually, in the manufacturing process, the manufacturing margin and the mask aligning margin should be considered. According to the manufacturing margin and the mask aligning margin, the gate electrode SG may not be completely overlapped with the bottle neck portion SLN.

That is, actually the gate electrode SG and the bottle neck portion SLN are not perfectly overlapped, but they are slightly mis-aligned each other. In that case, the gate-source parasitic capacitance Cgs and the gate-drain parasitic capacitance Cgd are formed with different capacitance amounts. These two parasitic capacitances are very small so that they do not affect the characteristics of the thin film transistor. However, when the mis-alignment between the gate electrode SG and the bottle neck portion SLN is very large, the difference between the gate-source parasitic capacitance Cgs and the gate-drain parasitic capacitance Cgd is also large. Then, this difference may give bad effect to the characteristics of the thin film transistor. For example, when the gate electrode SG may be shifted to the upper side in FIG. 11, the gate-drain parasitic capacitance Cgd is not formed but the gate-source parasitic capacitance Cgs is very large. Even though the parasitic capacitance is not considered at design step, due to the manufacturing margin during the manufacturing process, the gate-source parasitic capacitance Cgs may be formed with large amount.

In the fifth embodiment, a structure is provided for the organic light emitting diode display in which, even though the mis-alignment is caused, the deterioration of the thin film transistor due to the unevenness of the parasitic capacitance is prevented. The fourth embodiment and the fifth embodiment are the best mode for the present disclosure. The thin film transistor according to the fourth and fifth embodiments include all merits of the first to third embodiments and solve the problems caused by the structures and manufacturing process in these embodiments.

The fourth embodiment provides the thin film transistor substrate in which the thin film transistor has the double gate structure, and the parasitic capacitance may be eliminated under the ideally perfect manufacturing process. The fifth embodiment provides the thin film transistor substrate in which the thin film transistor has the single gate structure, and the parasitic capacitance is minimized and evenly distributed over the whole thin film transistor substrate. The fourth embodiment and the fifth embodiment have a trade-off relationship. Therefore, any one of the fourth and fifth embodiments would be preferably applied to the thin film transistor substrate, considering the manufacturing process and the characteristics of the thin film transistor.

Figure 13:
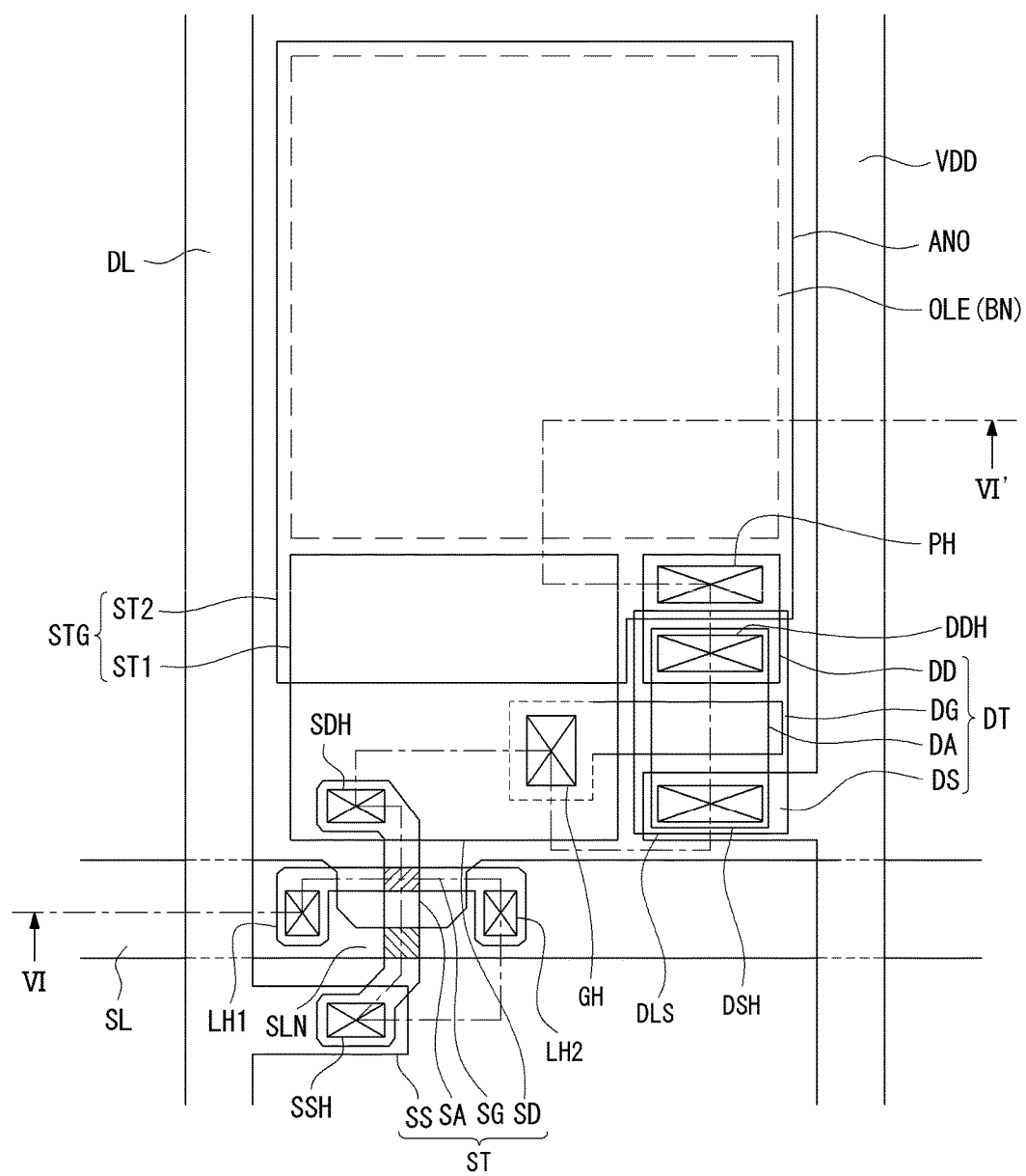
FIG. 13 is a plane view illustrating the structure of one pixel in the organic light emitting diode display according to the fifth embodiment of the present disclosure.
Figure 14:
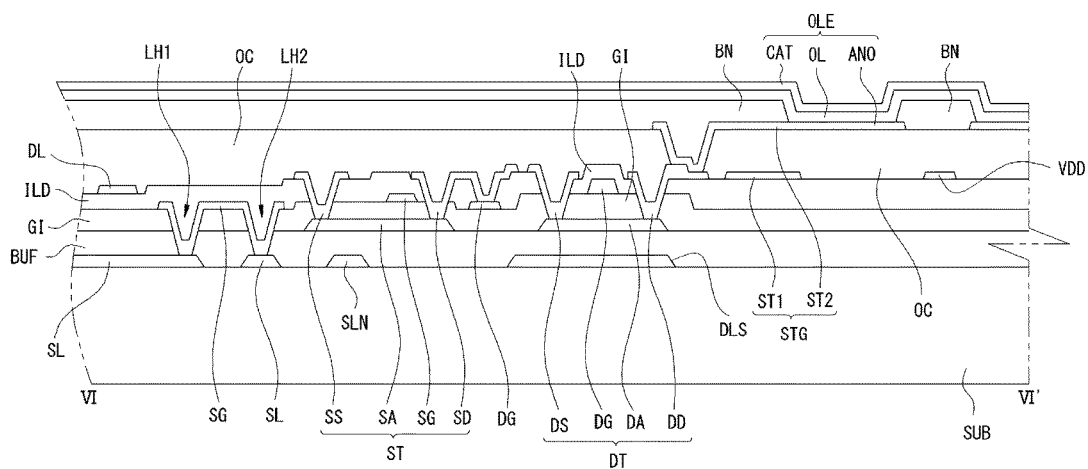
FIG. 14 is a cross sectional view, along the cutting line VI-VI' in FIG. 13, illustrating the structure of the organic light emitting diode display according to the fifth embodiment.

Hereinafter, referring to FIGS. 13 and 14, we will explain about the fifth embodiment. FIG. 13 is a plane view illustrating the structure of one pixel in the organic light emitting diode display according to the fifth embodiment of the present disclosure. FIG. 14 is a cross sectional view, along the cutting line VI-VI' in FIG. 13, illustrating the structure of the organic light emitting diode display according to the fifth embodiment.

FIGS. 13 and 14 show the structure of any one pixel area of the organic light emitting diode display according to the fifth embodiment. The features of the fifth embodiment will be described by focusing on the structure of the switching thin film transistor ST. As the thin film transistor according to the fifth embodiment has the similar structures of the former embodiments, the explanation of same features may not be duplicated.

The switching thin film transistor ST according to the fifth embodiment is similar to that of the fourth embodiment. The main difference is on the position relationship between the bottle neck portion SLN and the gate electrode SG.

Referring to FIG. 13, the scan line SL extends in the horizontal direction on the substrate SUB. The horizontal direction is corresponding to the direction from left side to the right side of the substrate. The scan line SL has a bottle neck portion SLN having the narrower width than the width of the other portions where the switching thin film transistor ST is disposed. The bottle neck portion SLN may have a width corresponding to ½ width to ⅓ width of the scan line SL. Further, the bottle neck portion SLN is disposed as shifter to the upper side or the lower side of the scan line SL. For example, in FIG. 13, the bottle neck portion SLN is disposed at the lower side of the scan line SL. Otherwise, the bottle neck portion SLN may be disposed at the upper side of the scan line SL.

The gate electrode SG is disposed as not being overlapped with the bottle neck portion SLN but being apart from the bottle neck portion SLN with a predetermined distance. The distance between the gate electrode SG and the bottle neck portion SLN is determined as considering the mask aligning margin. For example, when the mask aligning margin is 2 µm, the distance between the gate electrode SG and the bottle neck portion SLN may be at least 2 µm.

When the gate electrode SG is disposed as being shifted to the upper side or the lower side of the scan line SL due to the mis-alignment during the manufacturing process, the gate electrode SG is not overlapped with the bottle neck portion SLN. The gate electrode SG and the bottle neck portion SLN receive the gate signal, but the switching thin film transistor has the single gate structure because only the gate electrode SG is overlapped with the channel area of the semiconductor layer SA.

In detail, the switching thin film transistor ST has the top gate structure in which the gate electrode SG is disposed over the semiconductor layer SA. That is, the channel area can be exactly defined in the semiconductor layer SA. For example, doping the impurities into the semiconductor layer SA by using the gate electrode SG as the mask, the semiconductor layer SA except the area overlapped with the gate electrode SG are conductorized. As the result, the area overlapped with the gate electrode SG is defined as the channel area, the conductorized areas are defined as the source area and the drain area.

In FIG. 13, the overlapped area between the gate electrode SG and the semiconductor layer SA is the channel area illustrated with the 45° hatch pattern. This channel area is overlapped with the gate electrode SG only, but not overlapped with the bottle neck portion SLN. Therefore, the switching thin film transistor according to the fifth embodiment has the single gate structure.

In FIG. 13, the overlapped area between the bottle neck portion SLN and the semiconductor layer SA is the source area illustrated with the 135° hatch pattern. As the bottle neck portion SLN is overlapped with the source area, the gate-source parasitic capacitance Cgs is formed. However, as the width of the bottle neck portion SLN has the ½ or less width than the width of the scan line SL, the gate-source parasitic capacitance Cgs may be minimized.

Further, as shown in FIG. 13, only the gate-source parasitic capacitance Cgs exists. In another example that the bottle neck portion SLN is disposed at the upper side of the scan line SL and the gate electrode SG is disposed at the lower side of the scan line SL, only the gate-drain parasitic capacitance Cgd exists. That is, according to the fifth embodiment, the thin film transistor has only one parasitic capacitance and the amount of the parasitic capacitance is exactly expected or evaluated. Therefore, when designing the thin film transistor, the characteristics of the thin film transistor may be designed as considering the parasitic capacitance exactly. Even though any errors and/or misalignment are caused during the manufacturing process, all thin film transistors have the same parasitic capacitance having the same amount at the same location. As there is no deviation (or difference) among all of the parasitic capacitances, all thin film transistors have the same or very similar characteristics.

The switching thin film transistor for the organic light emitting diode display according to the fifth embodiment is disposed over the scan line SL, so that the ratio of the area for the thin film transistor in one pixel area may be minimized. As the scan line SL has one line body structure having no disconnected portion from the left side to the right side of the substrate, the line resistance is not increased. As the gate electrode SG is disposed as being apart from the bottle neck portion SLN of the scan line SL with a predetermined distance (corresponding to the manufacturing margin at least), there is no deviation of the parasitic capacitance among the thin film transistors even though manufacturing errors are occurred. In addition, as the scan line SL is made of the same material and at the same layer as the light shielding layer, the buffer layer BUF, the gate insulating layer GI and the intermediate insulating layer ILD are inserted between the data line DL and the scan line SL. When the structure of the thin film transistor according to the fifth embodiment is applied to the thin film transistor substrate for the large area and/or ultra high density display, the loads and/or resistances of the scan line SL and the data line DL are not increased, further the insulation breakdown is not occurred.

While the various embodiments of the present disclosure have been described in detail with reference to the drawings, it will be understood by those skilled in the art that the embodiments of the present disclosure can be implemented in other specific forms without changing the technical spirit or essential features of the disclosure. Therefore, it should be noted that the forgoing embodiments are merely illustrative in all aspects and are not to be construed as limiting the disclosure. The scope of the disclosure is defined by the appended claims rather than the detailed description of the disclosure. All changes or modifications or their equivalents made within the meanings and scope of the claims should be construed as falling within the scope of the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A device, comprising:
   a substrate;
   a scan line extending in a first direction on the substrate;
   a buffer layer on the scan line;
   a semiconductor layer extending in a second direction and crossing the scan line on the buffer layer;
   a gate insulating layer on the semiconductor layer;
   a gate electrode connected to the scan line, the gate electrode extending in the first direction and crossing the semiconductor layer on the gate insulating layer;
   an intermediate insulating layer on the gate electrode;
   a data line crossing the scan line on the intermediate insulating layer;
   a source electrode branching from the data line and contacting a first side of the semiconductor layer; and
   a drain electrode facing the source electrode and contacting a second side of the semiconductor layer,
   wherein the scan line includes a bottle neck portion at an area where the scan line crosses the semiconductor layer.

2. The device according to the claim 1, wherein the gate electrode overlaps the scan line, and
   the gate electrode is connected to the scan line via a contact hole penetrating the buffer layer and the gate insulating layer.

3. The device according to the claim 1, wherein the bottle neck portion is overlapped with the gate electrode, and
   wherein the scan line has a narrower width in the bottle neck portion than in other portions of the scan line.

4. The device according to the claim 3, wherein the gate electrode and the bottle neck portion have a same width and completely overlap each other.

5. The device according to the claim 1, wherein the scan line has a first side and a second side and a first width between the first side and the second side,
   wherein the bottle neck portion has a second width that is less than the first width, and is disposed adjacent to the first side of the scan line, and
   wherein the gate electrode is disposed adjacent to the second side of the scan line and is not overlapped with the bottle neck portion.

6. The device according to the claim 5, wherein the gate electrode and the bottle neck portion are spaced apart from each other with a predetermined distance.

7. The device according to the claim 1, further comprising:
   a driving current line crossing the scan line on the intermediate insulating layer;
   a driving thin film transistor connected between the drain electrode and the driving current line; and
   an organic light emitting diode connected to the driving thin film transistor.

8. A device, comprising:
   a substrate;

a scan line extending in a first direction on the substrate;

a semiconductor layer extending in a second direction that is transverse to the first direction, the semiconductor layer at least partially overlapping the scan line;

a gate electrode connected to the scan line, the gate electrode extending in the first direction and at least partially overlapping the semiconductor layer;

a data line extending in the second direction and crossing the scan line;

a source electrode that extends from the data line and contacts a first side region of the semiconductor layer; and a drain electrode that contacts a second side region of the semiconductor layer that is opposite to the first side region, wherein the scan line includes a bottle neck portion at an area where the scan line crosses over the semiconductor layer.

9. The device according to the claim 8, wherein the bottle neck portion is overlapped with the gate electrode, and wherein the scan line has a narrower width in the bottle neck portion than in other portions of the scan line.

10. The device according to the claim 9, wherein the gate electrode and the bottle neck portion have a same width and completely overlap each other.

11. The device according to the claim 8, wherein the scan line has a first side and a second side and a first width between the first side and the second side, wherein the bottle neck portion has a second width that is less than the first width, and is disposed adjacent to the first side of the scan line, and wherein the gate electrode is disposed adjacent to the second side of the scan line and is not overlapped with respect to the bottle neck portion.

\* \* \* \* \*